United States Patent [19]

Ishikawa

[11] Patent Number: 5,587,344

[45] Date of Patent: Dec. 24, 1996

[54] METHOD FOR FABRICATING AN OXYNITRIDE FILM FOR USE IN A SEMICONDUCTOR DEVICE

[75] Inventor: Hiraku Ishikawa, Tokyo, Japan

[73] Assignee: NEC Corporation, Tokyo, Japan

[21] Appl. No.: 429,144

[22] Filed: Apr. 26, 1995

[30] Foreign Application Priority Data

Jun. 3, 1994 [JP] Japan ................... 6-121639

[51] Int. Cl.$^6$ .................. H01L 21/316; H01L 21/318
[52] U.S. Cl. ............................ 437/238; 437/241
[58] Field of Search ......................... 437/238, 241

[56] References Cited

U.S. PATENT DOCUMENTS

| | | | |
|---|---|---|---|
| 4,656,729 | 4/1987 | Kroll, Jr. et al. | 29/571 |
| 4,854,263 | 8/1989 | Chang et al. | 118/715 |
| 4,894,352 | 1/1990 | Lang et al. | 437/238 |
| 5,043,152 | 3/1992 | Bonet et al. | 427/40 |
| 5,434,109 | 7/1995 | Geissler et al. | 437/239 |

OTHER PUBLICATIONS

"Silicon Nitride Formation From a Silane–Nitrogen Electron Cyclotron Resonance Plasma," Barbour et al., J. Vac. Sci. Technol. A 9 (3), May/Jun. 1991, pp. 480–484.

Primary Examiner—Robert Kunemund
Assistant Examiner—Matthew W. Whipple
Attorney, Agent, or Firm—Popham, Haik, Schnobrich & Kaufman, Ltd.

[57] ABSTRACT

The invention provides a method and an apparatus for fabricating a semiconductor device having a silicon oxynitride layer deposited on a semiconductor substrate by means of plasma-enhanced chemical vapor deposition with radio-frequency field being applied to the semiconductor substrate. The method and apparatus use a silane gas, an argon gas and a nitrogen gas as process gases on condition that a flow rate ratio of the argon gas to the silane and nitrogen gases is in the range of at least 1.1, and preferably 2.0 or less. The method and apparatus preferably further use an oxygen gas on condition that a flow rate ratio of the nitrogen gas to the oxygen and nitrogen gases is in the range of at least 0.25, and preferably 0.6 or less. By controlling flow rate ratios of the above mentioned gases in the above mentioned range, the invention provides a silicon oxynitride layer having enhanced burying characteristic and water-permeability resistance and also having smaller dielectric constant and layer stress.

2 Claims, 7 Drawing Sheets

METHOD FOR FABRICATING AN OXYNITRIDE FILM FOR USE IN A SEMICONDUCTOR DEVICE

BACKGROUND OF THE INVENTION

1. Field of the Invention

The invention relates to a method and an apparatus for fabricating a semiconductor device, and more particularly to such a method and an apparatus for providing a flat insulative layer with a semiconductor device.

2. Description of the Related Art

With a need for higher integration of a semiconductor device, interconnections for communicating transistors, of which a semiconductor device is composed, with each other have to be thinner in diameter. Further with more complexity of a structure of a semiconductor device, such interconnections have to be formed in multi-layered structure. Such thinner diameter interconnections and multi-layered structure interconnections cause a spacing between interconnections to be in a sub-micron order. A conventional plasma-enhanced chemical vapor deposition, which is hereinafter referred to simply as "PE-CVD", is no longer able to bury such a quite narrow spacing with a silicon layer. The conventional PE-CVD cannot provide an appropriate step coverage of a silicon layer, and hence it is unavoidable that there remain large voids in a narrow space between interconnections. In subsequent semiconductor fabricating steps, humidity and/or impurities to be used in such steps tend to remain in the voids, thereby remarkably deteriorating performance and reliability of the products.

As a solution to such a problem, there has been suggested a silicon oxide layer to be produced by means of plasma-enhanced chemical vapor deposition with radio-frequency field being applied to a semiconductor substrate (hereinafter, this is called as bias plasma CVD). The silicon oxide layer produced by the bias plasma CVD is able to bury a quite narrow space therewith, however, is not able to protect active portions of a semiconductor device from humidity and/or impurities to be used in semiconductor device fabricating processes. Thus, there has been also suggested a silicon oxynitride layer to be produced by means of the bias plasma CVD in place of the above mentioned silicon oxide layer.

For instance, Japanese Unexamined Patent Public Disclosure No. 3-38038 has suggested a method for depositing an insulative layer on a substrate having a step by means of bias electron cyclotron resonance plasma-enhanced chemical vapor deposition. This method uses a silane family gas and $N_2O$ as process gases to control either microwave outputs or a flow rate ratio of the silane family gas to $N_2O$, to thereby form an insulative layer which can bury narrow spacing between interconnections therewith. An experiment was actually carried out in the Disclosure on condition that $N_2O$ and $SiH_4$ gases were introduced at 35 sccm and 21 sccm, respectively, the operating pressure for forming the insulative layer was $7 \times 10^{-4}$ Torr, the radio-frequency (RF) power was 500 W, and the microwave output was in the range of 200 to 1000 W. In another experiment, a flow rate ratio of $SiH_4$ gas to $N_2O$ gas was set to be 0.5, the operating pressure for forming the insulative layer was $7 \times 10^4$ Torr, the radio-frequency (RF) power was 500 W, and the microwave output was 1000 W. The Disclosure describes that it is possible to form an insulative layer having an appropriate burning characteristic under the foregoing conditions.

For another instance, silicon nitride formation from a silane has been suggested by J. C. Barbour, H. J. Stein, O. A. Popov, M. Yoder and C. A. Outten in "Silicon nitride formation from a silane-nitrogen electron cyclotron resonance plasma", J. Vac. Sci. Technol. A, Vol. 9, No. 3, pp 480–484, May/June 1991. According to the article, low temperature silicon nitride and oxynitride films were deposited downstream from an electron cyclotron resonance plasma source using $SiH_4$ and $N_2$ gas mixtures. The Si/N ratio and H content in the deposited films were determined using Rutherford backscattering spectrometry and elastic recoil detection. The H concentration was minimum for films with compositions closest to that of stoichiometric $Si_3N_4$. The optimum conditions for producing a stoichiometric $Si_3N_4$ were a $SiH_4/N_2$ flow ratio between 0.1 and 0.2, and an electrically isolated sample far from the ECR source. Infrared absorption spectra showed that as the film composition changed from N rich to Si rich the dominant bonds associated with H changed from N—H to Si—H.

Figure 1:
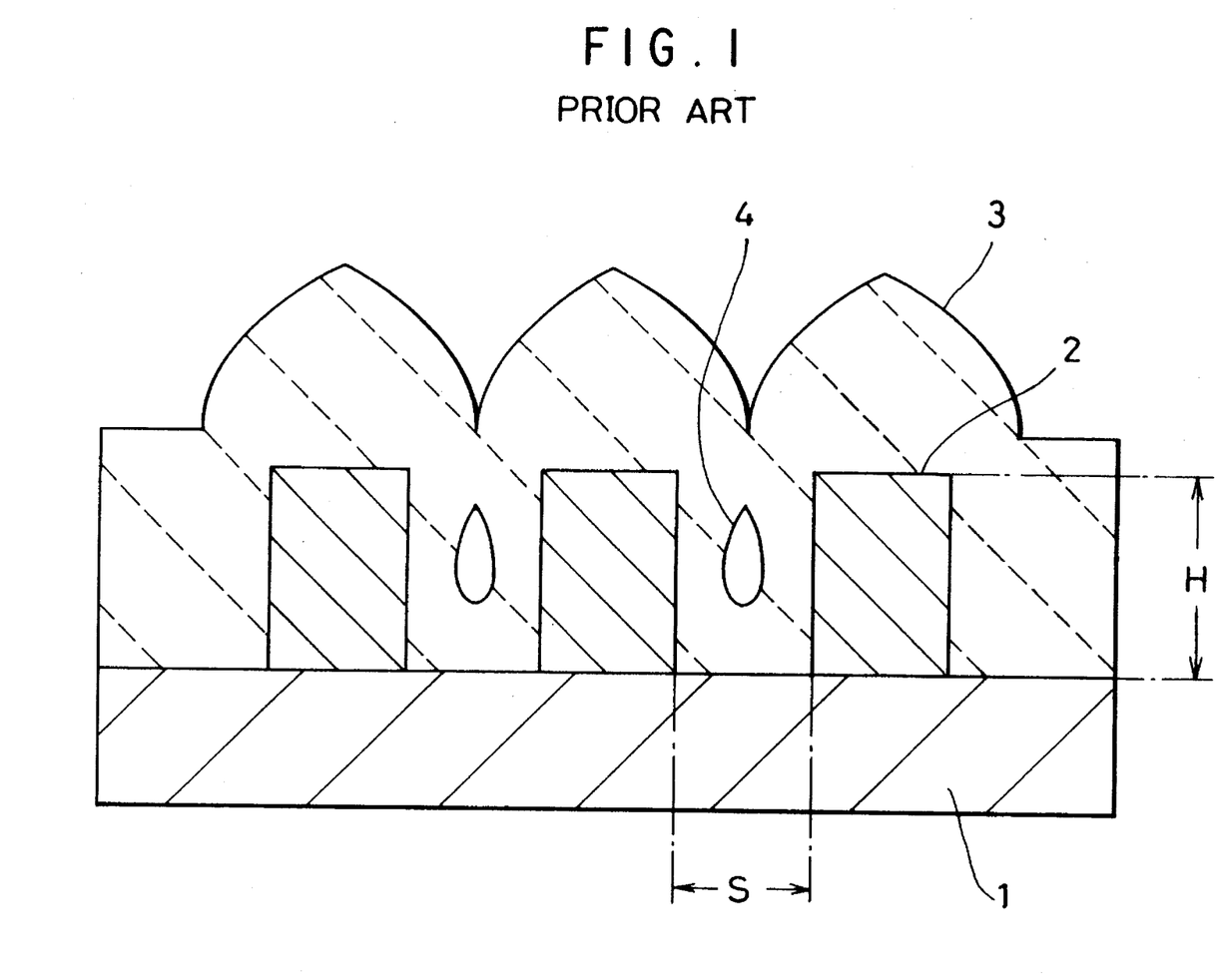
FIG. 1 is a cross-sectional view of interconnections mounted on a substrate, over which a conventional silicon oxynitride layer is deposited.

The methods for fabricating a semiconductor device having a multilayered interconnection structure by using a conventional process for forming a silicon oxynitride layer has problems as follows. Firstly, the conventional methods cannot individually control amounts of nitrogen and oxygen to be present in a silicon oxynitride layer, and accordingly cannot provide a desired quality of the silicon oxynitride layer. Secondly, the performance of the conventionally formed silicon oxynitride layer to bury a space located between interconnections therewith is mainly dominated by sputtering effect of an argon gas and bias radio-frequency power, and thus less dominated by a gas flow rate of silane family gas and $N_2O$ gas mixtures and microwave power. FIG. 1 illustrates the deposition of a conventional silicon oxynitride layer. On a substrate 1 are arranged metal interconnections 2 with a spacing S being given between the adjacent interconnections 2. When the spacing S is small, and further when a height H of the interconnections 2 is large, in other words, an aspect ratio of the interconnections 2 is large, it was not possible for the conventional silicon oxynitride layer 3 to avoid generation of voids 4 in the space located between the adjacent interconnections 2.

As earlier explained, the conventional processes for forming a silicon oxynitride layer cannot control the quality of the layer, and also cannot provide desired performance to bury a space located between adjacent interconnections therewith.

SUMMARY OF THE INVENTION

It is an object of the present invention to provide a method and an apparatus for fabricating a semiconductor device, which method and apparatus provide a silicon oxynitride layer having enhanced burying characteristic and water-permeability resistance, and also having smaller dielectric constant and layer stress, by using a silane gas, an oxygen gas, a nitrogen gas and an argon gas as process gases and further controlling a flow rate ratio of these gases so that the flow rate ratio is kept to be in a specific range.

In one aspect, the invention provides a method for fabricating a semiconductor device, including the step of depositing a silicon oxynitride layer by means of plasma-enhanced chemical vapor deposition (PE-CVD) with radio-frequency field being applied to a semiconductor substrate. The plasma-enhanced chemical vapor deposition uses a silane gas, an argon gas and a nitrogen gas as process gases on condition that a flow rate ratio of the argon gas to the silane and nitrogen gases is in the range of at least 1.1.

The flow rate ratio of the argon gas to the silane and nitrogen gases is preferably 2.0 or less.

The flow rate ratio of the argon gas to the silane and nitrogen gases is determined in dependence on an aspect ratio of an interconnection to be buried in the silicon oxynitride layer.

In a preferred embodiment, the plasma-enhanced chemical vapor deposition further uses an oxygen gas as a process gas on condition that a flow rate ratio of the nitrogen gas to the oxygen and nitrogen gases is in the range of at least 0.25.

The flow rate ratio of the nitrogen gas to the oxygen and nitrogen gases is preferably 0.6 or less.

In another aspect, the invention provides an apparatus for fabricating a semiconductor device having a silicon oxynitride layer to be deposited by means of plasma-enhanced chemical vapor deposition (PE-CVD) with radio-frequency field being applied to a semiconductor substrate, the apparatus including (a) a reaction chamber, (b) a plasma chamber in which plasma is produced, the plasma chamber being in communication with the reaction chamber, (c) a device such as coils for producing radio-frequency field to be applied to a semiconductor substrate placed in the reaction chamber, (d) a nitrogen gas source, (e) a silane gas source, (f) an argon gas source, (g) a first conduit through which the nitrogen gas is introduced into the plasma chamber, (h) a second conduit through which the silane and argon gases are introduced into the reaction chamber, and (i) a controller such as a controlling valve for controlling flow rates of the silane, nitrogen and argon gases so that a flow rate ratio of the argon gas to the silane and nitrogen gases is in the range of at least 1.1.

In a preferred embodiment, the controller further controls flow rates of the silane, nitrogen and argon gases so that the flow rate ratio of the argon gas to the silane and nitrogen gases is 2.0 or less.

In another preferred embodiment, the controller determined the flow rate ratio of the argon gas to the silane and nitrogen gases in dependence on an aspect ratio of an interconnection to be buried in the silicon oxynitride layer.

In still another preferred embodiment, the apparatus further includes an oxygen gas source, an oxygen gas from the oxygen gas source being introduced into the plasma chamber through the first conduit, and the controller controls flow rates of the nitrogen and oxygen gases so that a flow rate ratio of the nitrogen gas to the oxygen and nitrogen gases is in the range of at least 0.25.

In yet another preferred embodiment, the controller further controls flow rates of the nitrogen and oxygen gases so that the flow rate ratio of the nitrogen gas to the oxygen and nitrogen gases is 0.6 or less.

The advantages obtained by the aforementioned present invention will be described hereinbelow. As aforementioned, the invention provides a silicon oxynitride layer having enhanced burying characteristic and water-permeability resistance, and also having smaller dielectric constant and layer stress. The use of the silicon oxynitride layer as an insulative layer enhances hot carrier resistance of a transistor, and further makes it possible for a transistor to have approximately 1.5 times longer span of life than that of a conventional one. In addition, the use of the silicon oxynitride layer doubles a span of life of thin interconnections.

In addition to the foregoing, the invention also makes it possible to reduce parasitic capacity of a transistor and an interconnection tube by approximately 10% with the result of higher operation speed of a semiconductor device.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A preferred embodiment in accordance with the present invention will be explained hereinbelow with reference to drawings.

Figure 2:
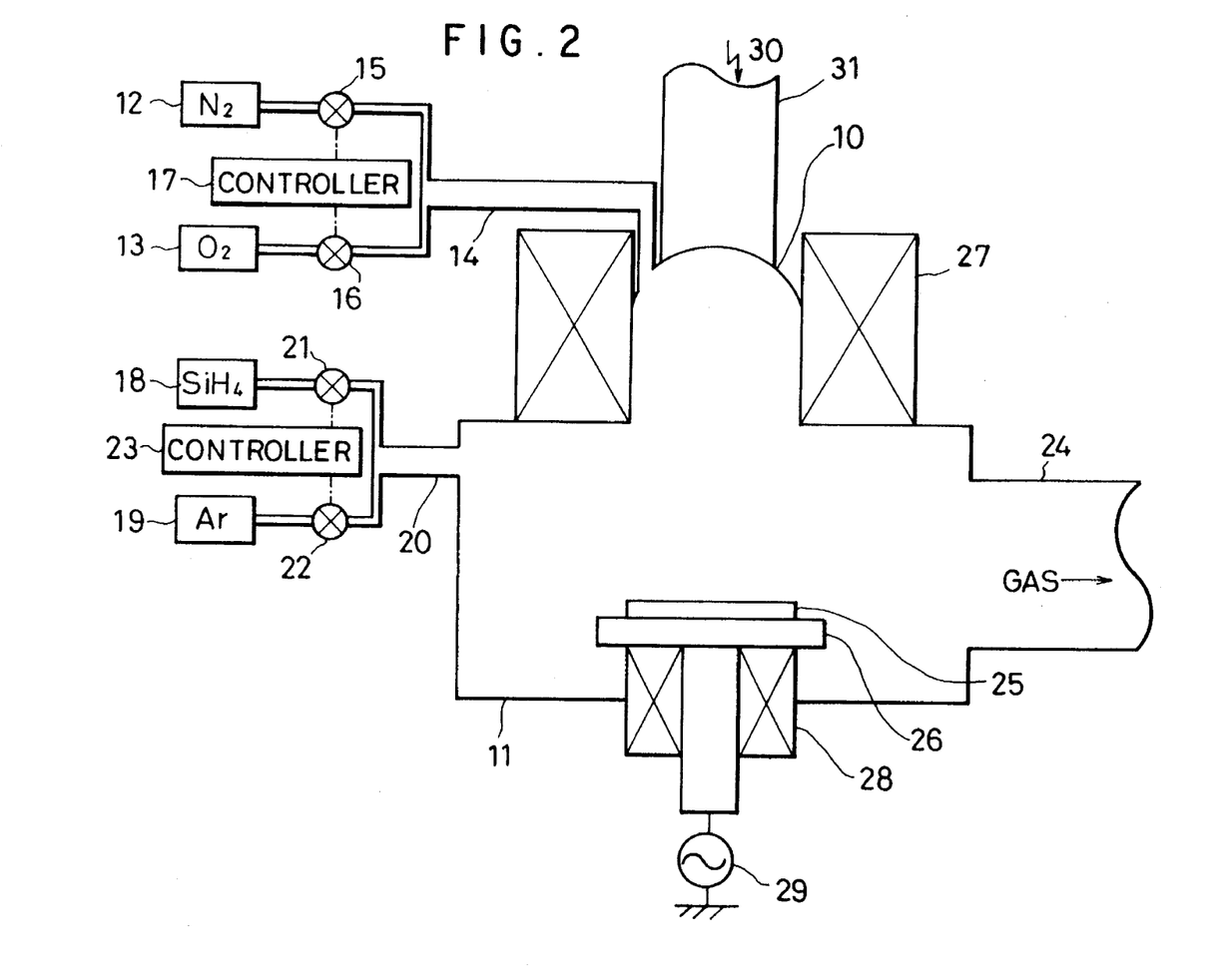
FIG. 2 is a schematic cross-sectional view of an apparatus in accordance with the embodiment of the invention.

FIG. 2 illustrates a bias plasma-enhanced chemical vapor deposition (PE-CVD) apparatus for fabricating a semiconductor device in accordance with an embodiment. The apparatus includes a plasma chamber 10 and a reaction chamber 11 in communication with and located beneath the plasma chamber 10. A nitrogen gas source 12 and an oxygen gas source 13 are in fluid communication with the plasma chamber 10 through a first conduit 14. On way of the first conduit 14 are disposed control valves 15 and 16. A first controller 17 controls an opening degree of each of the control valves 15 and 16 to thereby control flow rate of the nitrogen and oxygen gases to be fed to the plasma chamber 10 through the first conduit 14.

In the same way, a silane gas source 18 and an argon gas source 19 are in fluid communication with the reaction chamber 11 through a second conduit 20. On way of the second conduit 20 are disposed control valves 21 and 22. A second controller 23 controls an opening degree of each of the control valves 21 and 22 to thereby control flow rate of the silane and argon gases to be fed to the reaction chamber 11 through the second conduit 20. The reason why the nitrogen and, oxygen gases and the silane and argon gases are separately introduced into the chambers 10 and 11 is to prevent the generation of particles in a silicon oxynitride layer and also to protect the plasma chamber 10 from damages to be caused by the argon gas.

The reaction chamber 11 is formed at one end thereof with an outlet 24 through which the residual silane and argon gases together with the nitrogen and oxygen gases are exhausted. In the reaction chamber 11 is placed a substrate 25 on a susceptor 26.

A primary coil 27 is disposed around the plasma chamber 10, and a preliminary coil 28 is disposed below the susceptor 26. A radio-frequency (rf) voltage source is electrically connected to both the primary coil 27 and the preliminary coil 28. A microwave emitter 30 is in communication with the plasma chamber 10 through a conduit 31. By providing a radio-frequency voltage with the coils 27 and 28, there is produced a radio-frequency field in the plasma chamber 10, which in turn produces plasma in the plasma chamber 10. Thus, a silicon oxynitride layer is deposited on the substrate 25, on which interconnections are arranged, by means of PE-CVD.

Figure 3:
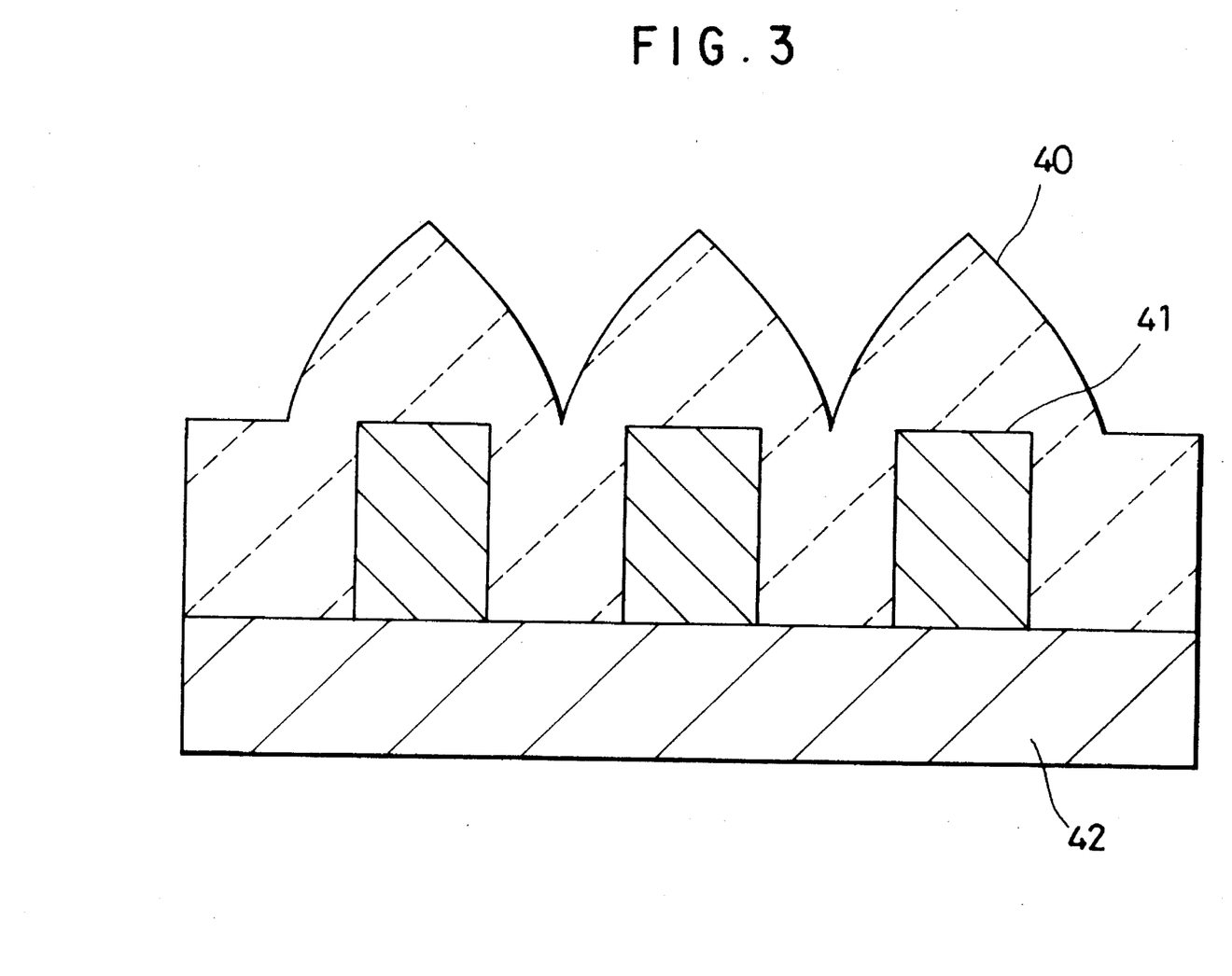
FIG. 3 is a cross-sectional view of interconnections mounted on a substrate, over which a silicon oxynitride layer in accordance with the embodiment is deposited.

In operation, the second controller 23 determines an opening degree of the control valves 21 and 22 so that a ratio of a flow rate of the argon gas to total flow rate of the silane and nitrogen gases is in the range of 1.1 to 2.0 both inclusive. For instance, when flow rates of the silane gas and the nitrogen gases are 50 sccm and 25 sccm, respectively, the second control valve 23 determines an opening degree of the control valve 22 so that a flow rate of the argon gas is in the range of 82.5 sccm to 150 sccm both inclusive. The silicon oxynitride layer formed under the above mentioned conditions is illustrated in FIG. 3. The silicon oxynitride layer 40 in accordance with the embodiment makes it possible to cause voids not to be generated in a space between adjacent interconnections 41 mounted on a substrate 42.

Figure 4:
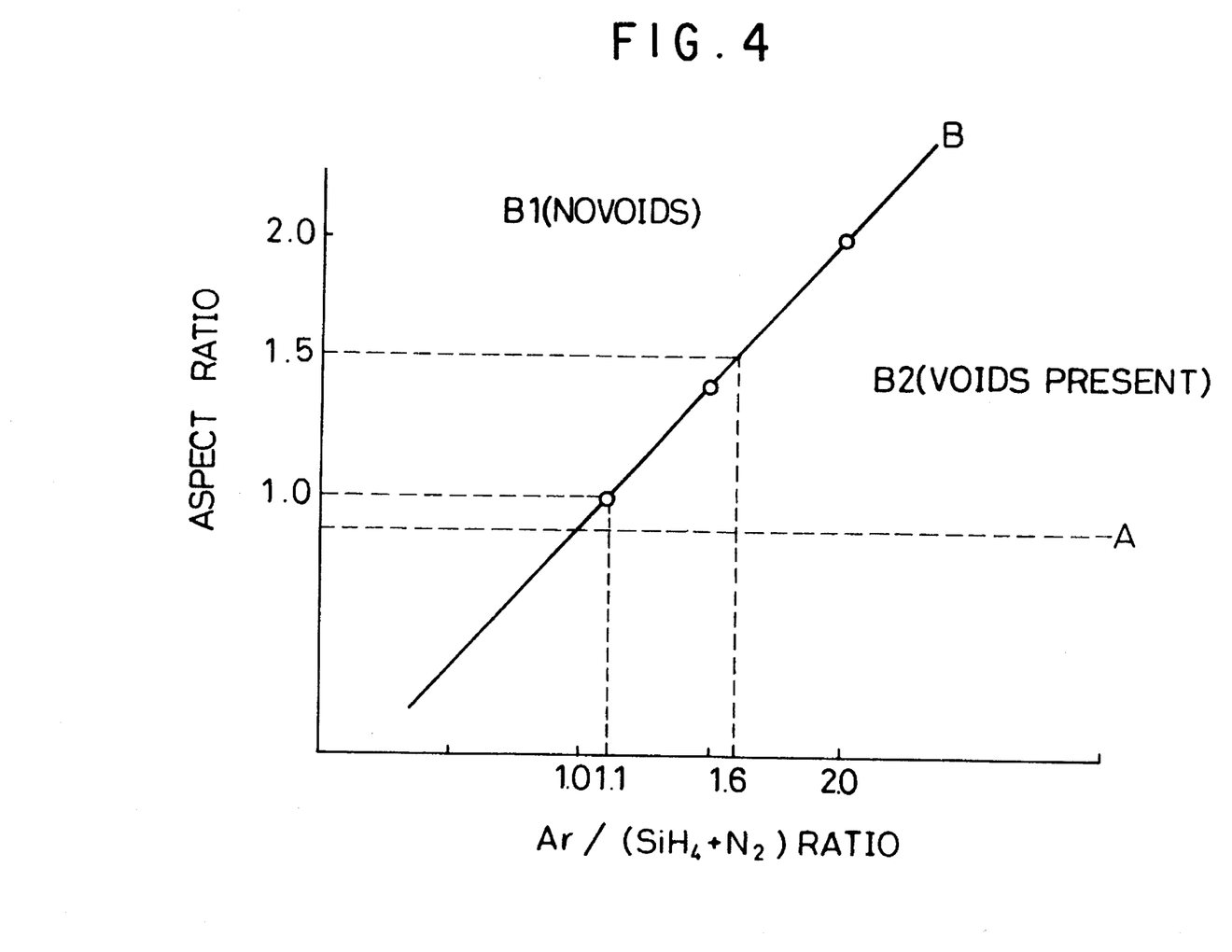
FIG. 4 is a graph showing a relationship between an aspect ratio of an interconnection to be buried in the silicon oxynitride layer and $Ar/(SiH_4+N_2)$ flow rate ratio.

FIG. 4 shows a relationship between an aspect ratio of an interconnection to be buried in the silicon oxynitride layer and $Ar/(SiH_4+N_2)$ flow rate ratio. In FIG. 4, a region located under a broken line A is a region in which a conventional silicon oxynitride layer can be deposited over interconnections without voids to be generated in a space between adjacent interconnections. A region B1 located above a solid line B is a region in which there is no generated voids in a space between adjacent interconnections, and a region B2 located under the line B is a region in which there are generated voids in a space between adjacent interconnections.

As is obvious in FIG. 4, the silicon oxynitride layer in accordance with the invention provides better performance for deposition in a space between adjacent interconnections than a conventional silicon oxynitride layer. When the flow rate of the argon gas is 55 sccm, the silicon oxynitride layer can be deposited without generation of voids for interconnections having an aspect ratio up to 1.0. When the flow rate of the argon gas is 100 sccm, the silicon oxynitride layer can be deposited without generation of voids for interconnections having an aspect ratio up to 2.0. The conditions for formation of the silicon oxynitride layer are as follows: microwave output is 2000 W, rf bias output is 1400 W, an operating pressure is $3.0 \times 10^{-3}$ Torr, and a flow rate of the oxygen gas is 50 sccm.

The flow rate ratio of the argon gas to the silane and nitrogen gases, which is represented as $Ar/(SiH_4+N_2)$ ratio in FIG. 4, needs to be at least 1.1, however, does not always need to be below 2.0. If the $Ar/(SiH_4+N_2)$ ratio is over 2.0, the deposition speed of the silicon oxynitride layer may be lowered. Hence, the $Ar/(SiH_4+N_2)$ ratio is preferably below 2.0.

The $Ar/(SiH_4+N_2)$ ratio may be determined in dependence on an aspect ratio of interconnections to be buried in the silicon oxynitride layer. For instance, if an aspect ratio of interconnections is 1.5, the $Ar/(SiH_4+N_2)$ ratio may be determined in the range of 1.1 to 1.6.

In addition to the $Ar/(SiH_4+N_2)$ ratio being determined to be in the range of 1.1, preferably, to 2.0, the first controller 17 controls an opening degree of the control valves 15 and 16 so that a flow rate ratio of the nitrogen gas to the oxygen and nitrogen gases, which is hereinafter referred to as $N_2/(N_2+O_2)$ ratio, is in the range of 0.25 to 0.6 both inclusive. For instance, when a flow rate of the silane gas is 50 sccm and a total flow rate of the nitrogen and oxygen gases is 75 sccm, a flow rate of the nitrogen gas is determined to be in the range of 18.75 sccm to 45 sccm. When the flow rate of the nitrogen gas is 18.75 sccm and 45 sccm, the flow rate of the oxygen gas is 56.25 sccm and 30 sccm, respectively. A flow rate of the argon gas is determined to be 105 sccm.

Figure 5:
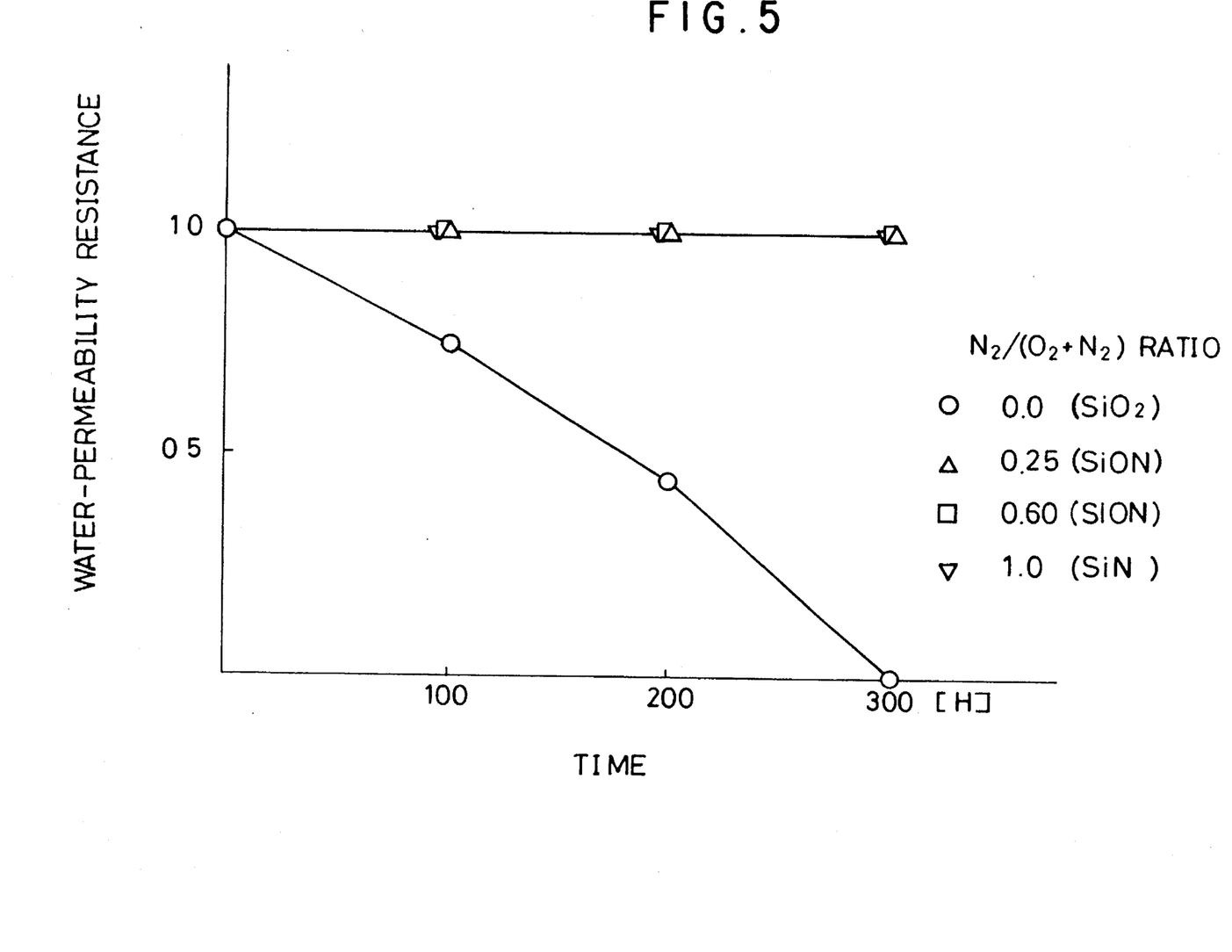
FIG. 5 is a graph showing the water-permeability resistance of the silicon oxynitride layer formed in accordance with the embodiment of the invention.

FIG. 5 shows water-permeability resistance of the silicon oxynitride layer when the $N_2/(N_2+O_2)$ ratio is determined to be in the above mentioned range. In FIG. 5, an axis of ordinate represents water-permeability resistance and an axis of abscissa represents a period of test time. When the water-permeability resistance is equal to 1.0, the silicon oxynitride layer does not allow water to pass therethrough at all, and when the water-permeability resistance is equal to 0, the silicon oxynitride layer allows water to entirely pass therethrough. Thus, the less value represents the less water-permeability resistance. As can be seen in FIG. 5, when the $N_2/(N_2+O_2)$ ratio is equal to 0.0, the water-permeability resistance is decreased as times go by. When about 300 hours has passed, the water-permeability resistance of the silicon oxynitride layer reaches zero (0). On the other hand, when the $N_2/(N_2+O_2)$ ratio is 0.25, 0.60 or 1.0, the water-permeability resistance is kept to be 1.0, in other words, the silicon oxynitride layer keeps water from passing therethrough. Thus, FIG. 5 shows that the $N_2/(N_2+O_2)$ ratio needs to be 0.25 at least.

Figure 6:
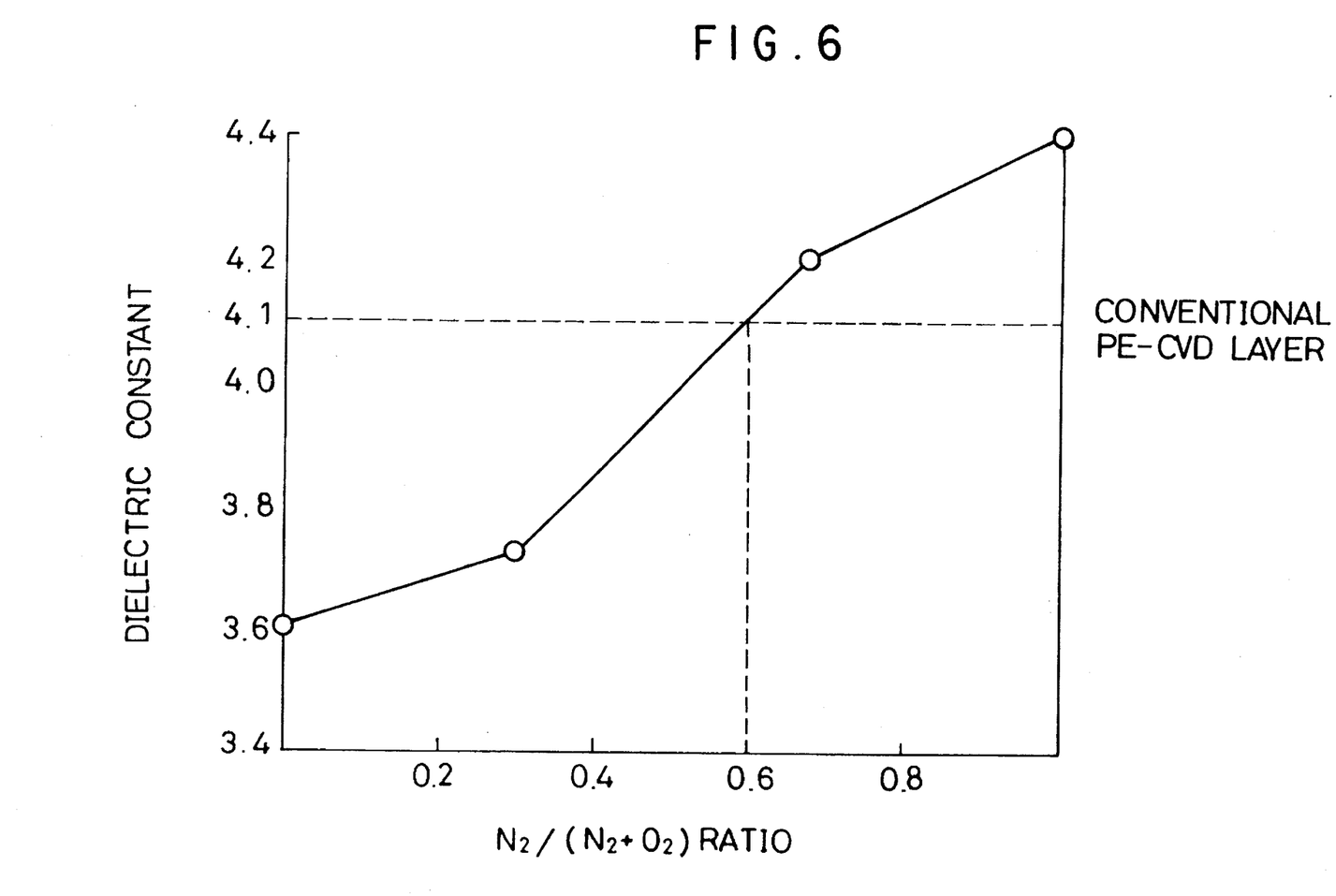
FIG. 6 is a graph showing the dielectric constant of the silicon oxynitride layer formed in accordance with the embodiment of the invention.

FIG. 6 shows a dielectric constant of the silicon oxynitride layer when the $N_2/(N_2+O_2)$ ratio is determined to be in the above mentioned range. A conventional silicon oxide layer formed by PE-CVD and used as an insulative layer has a dielectric constant of approximately 4.1. As is obvious in FIG. 6, when the $N_2/(N_2+O_2)$ ratio is equal to or smaller than 0.6, a dielectric constant is less than 4.1 which is a dielectric constant of a conventional silicon oxynitride layer. Thus, by setting the $N_2/(N_2+O_2)$ ratio to be equal to or less than 0.6, the silicon oxynitride layer can have a dielectric constant equal to or less than that of a conventional silicon oxynitride layer.

Figure 7:
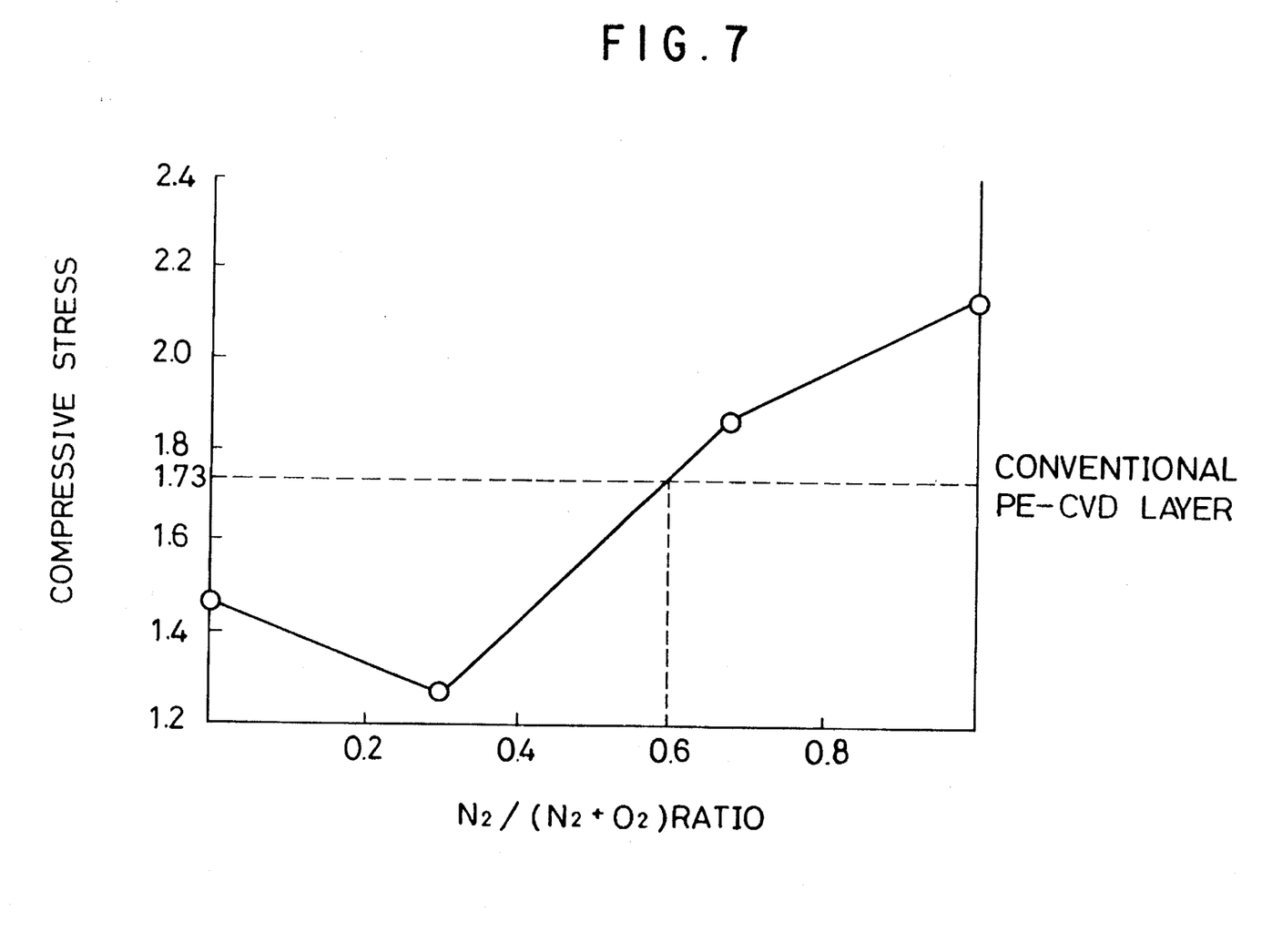
FIG. 7 is a graph showing the layer stress of the silicon oxynitride layer formed in accordance with the embodiment of the invention.

FIG. 7 shows a relationship between a layer stress and the $N_2/(N_2+O_2)$ ratio. A conventional silicon oxynitride layer formed by means of PE-CVD has a stress of $1.73 \times 10^9$ dyne/cm$^2$. As is obvious in FIG. 7, when the $N_2/(N_2+O_2)$ ratio is smaller than 0.6, a layer stress is smaller than $1.73 \times 10^9$ dyne/cm$^2$. With also respect to a layer stress, the $N_2/(N_2+O_2)$ ratio is preferable to be equal to or smaller than 0.6.

In the above mentioned embodiment, the $SiH_4$ gas is used as one of process gases, however, other similar gases may be used in place of the $SiH_4$ gas, such as $Si_2H_6$, $SiH_3F$, $SiH_3Cl$, $SiH_2F_2$ and $SiH_2Cl_2$.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method for fabricating a semiconductor device, said method comprising the steps of depositing a silicon oxynitride layer by means of plasma-enhanced chemical vapor deposition with a radio-frequency field being applied to a semiconductor substrate, said plasma-enhanced chemical vapor deposition using a silane gas, an argon gas, an oxygen gas and a nitrogen gas as process gases on condition that a flow rate ratio of said argon gas to said silane and nitrogen gases is in the range of 1.1 to 2.0 inclusive, and that a flow rate ratio of said nitrogen gas to said oxygen and nitrogen gases is in the range of 0.25 to 0.6 inclusive.

2. The method as recited in claim 1, wherein said flow rate ratio of said argon gas to said silane and nitrogen gases is determined in dependence on an aspect ratio of an interconnection to be buried in said silicon oxynitride layer.

* * * * *